(12) United States Patent
Chung et al.

(10) Patent No.: US 7,664,906 B2
(45) Date of Patent: Feb. 16, 2010

(54) FLASH MEMORY ACCESS APPARATUS AND METHOD

(75) Inventors: Tae-sun Chung, Seoul (KR); Bum-soo Kim, Anyang-si (KR); Yong-seok Kwon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 460 days.

(21) Appl. No.: 10/802,010

(22) Filed: Mar. 17, 2004

(65) Prior Publication Data

US 2004/0193781 A1 Sep. 30, 2004

(30) Foreign Application Priority Data

Mar. 31, 2003 (KR) .................. 10-2003-0020103

(51) Int. Cl.
*G06F 12/02* (2006.01)
(52) U.S. Cl. ........................ 711/103; 711/159
(58) Field of Classification Search .................. 711/103, 711/159
See application file for complete search history.

(56) References Cited

U.S. PATENT DOCUMENTS

| 6,381,176 B1 * | 4/2002 | Kim et al. .............. 365/185.11 |
| 2001/0048121 A1 | 12/2001 | Mizushima et al. |
| 2002/0099904 A1 * | 7/2002 | Conley ..................... 711/103 |

FOREIGN PATENT DOCUMENTS

| JP | 6-111588 A | 4/1994 |
| JP | 9-97206 A | 4/1997 |
| JP | 11-96779 A | 4/1999 |
| JP | 2000-284996 A | 10/2000 |
| JP | 2002-123421 A | 4/2002 |
| JP | 2004-533029 A | 10/2004 |
| KR | 2001-0029171 A | 4/2001 |
| KR | 2002-0028624 A | 4/2002 |
| WO | WO 02/058074 A2 | 7/2002 |

OTHER PUBLICATIONS

How Flash Memory Works, How Stuff Works [online], [retrieved on Jun. 8, 2009], Retreived from the Internet (URL: http://electronics.howstuffworks.com/flash-memory1.htm>, pp. 1-3.*

* cited by examiner

*Primary Examiner*—Christian P Chace
*Assistant Examiner*—Jared I Rutz
(74) *Attorney, Agent, or Firm*—Sughrue Mion, PLLC

(57) ABSTRACT

A flash memory access apparatus and method improves the overall performance of a flash memory system by minimizing the deterioration of performance of a flash memory due to repeated write operations through a minimized process of a write operation and the process of a recovery operation in consideration thereof and by allowing a stable recovery even though an error occurs. The flash memory access apparatus comprises a flash memory with regions divided on the basis of a unit that consists of predetermined blocks; and a flash memory controller. When a write operation is requested for a specific logical block number of the flash memory, the flash memory controller writes data and meta-information in a physical block corresponding to a logical block with the logical block number in the absence of a previous write operation for the logical block, but performs a write operation for writing the data and the meta-information allocated to the logical block in a new physical block without changing flash memory state information written in a previous physical block corresponding to the logical block in case of the presence of the previous write operation.

16 Claims, 9 Drawing Sheets

FIG. 1A
LBN-to-LUN
| LBN | LUN |
|---|---|
| 1 | 1 |
| 2 | 1 |
| 3 | 2 |
| 4 | 2 |
| 5 | 2 |
| ..... | ..... |
FIG. 1B
LUN-to-PUN
| LUN | PUN |
|---|---|
| 1 | 3 |
| 2 | 1 |
| ..... | ..... |
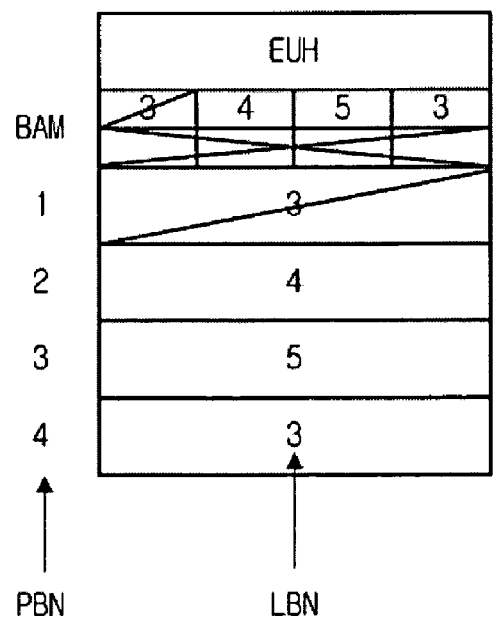
FIG. 1C
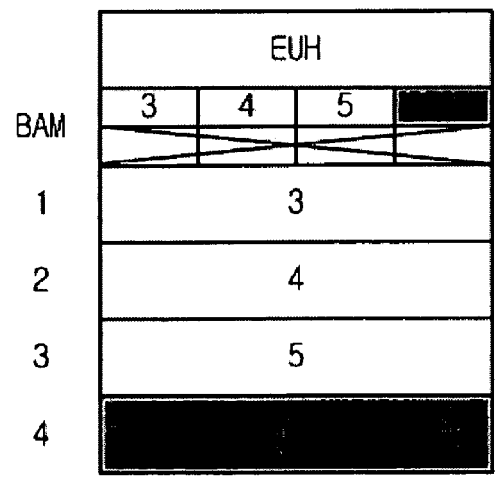
FIG. 1D

FLASH MEMORY ACCESS APPARATUS AND METHOD

This application is based on and claims priority from Korean Patent Application No. 10-2003-0020103 filed on Mar. 31, 2003 in the Korean Intellectual Property Office, the disclosure of which is incorporated herein by reference.

BACKGROUND OF THE INVENTION

1. Field of the Invention

The present invention relates to a flash memory access apparatus and method. More particularly, the present invention relates to a flash memory access apparatus and method, in which a process of a write operation gaining access to a flash memory in response to a write operation required by a processor is minimized and an occurrence of a system error is prevented through the process of a recovery operation based on the minimized process of the write operation, thereby recovering a system upon occurrence of a system error and minimizing deterioration of performance of the flash memory.

2. Description of the Prior Art

In general, since a flash memory is a nonvolatile and programmable memory that allows fast access thereto and has low power consumption, it has been widely used in embedded systems including mobile devices such as mobile phones and personal data assistants (PDAs).

In such a flash memory, data stored at specific locations can be randomly accessed in the same manner as existing RAMs, nonvolatile storage devices, magnetic devices or the like. However, when data is modified or deleted, the data is accessed on a block basis contrary to existing storage devices.

That is, in the flash memory, access is gained based on the block which written data is retrieved from or data is written in at once during read/write operations, and based on a unit which comprises a plurality of blocks and can be erased through one delete operation. As a method of efficiently managing data according to the access characteristics of the flash memory, a block (or sector) re-mapping scheme has been generally used.

The block (or sector) re-mapping scheme uses information on mapping between a physical block number (hereinafter, referred to as 'PBN') and a logical block number (hereinafter, referred to as 'LBN') of specific data written in a flash memory through a mapping table so that even though the PBN of the data is changed due to modification or deletion of the data, the data can be accessed using the same LBN.

In such existing block re-mapping schemes, flash memory state information written in the mapping table should be modified whenever write, delete and modify operations required by a processor are performed. Accordingly, there is a problem in that the performance of the flash memory is lowered due to such repeated write operations.

To solve this problem, a method of controlling a flash memory has been proposed. FIGS. 1A-1D show views of blocks of a flash memory for illustrating processes of operations according to the proposed method of controlling the flash memory.

The method is disclosed in the previously filed Korean Patent Application No. 1999-0041835 entitled "Flash Memory and Method of controlling the Same." FIGS. 1C and 1D shows structures of a physical unit.

Each unit has a header or erase unit header ("EUH") and a block allocation map (hereinafter, referred to as "BAM") and actually stores data therein. A variety of meta-information on the header is stored in the header, and information (logical block numbers, state, and the like) on blocks belonging to a specific unit is written in the BAM.

If a write operation for a specific LBN 3 of a flash memory is requested initially, the logical unit number (hereinafter, referred to as "LUN") 2 for the given LBN 3 is searched for by using an LBN-to-LUN table shown in FIG. 1A. Then, when LUN 2 is determined, a physical unit number (hereinafter, referred to as "PUN") is searched for by using an LUN-to-PUN table shown in FIG. 1B.

When PUN 1 is determined in such a way, a currently writable PBN is searched for through a BAM corresponding to PUN 1, and data to be written through a write operation are written in the searched PBN 1. Then, LBN 3 and state information of "valid" are written in a first field of the BAM corresponding to PBN 1.

In such a way, if an operation to update the written data of LBN 3 is requested after operations for LBN 4 and 5 are performed, the data of LBN 3 that will be updated while a new PBN will be allocated thereto are written in PBN 4 that is newly allocated to the data, and LBN 3 and state information of "valid" are written in a fourth field of the BAM corresponding to PBN 4.

Then, the data previously written in PBN 1 in which the updated LBN 3 was written, and LBN 3 that was written in the first field of the BAM corresponding to PBN 1 are deleted. State information of "deleted" is also written.

If there is no available free block in PUN 1 due to such write and update operations and PUN 2 is an available free block, only valid data written in PUN 1 is copied to a new PUN 2 in order to more efficiently use the flash memory.

Furthermore, according to Korean Patent Application No. 2000-0059731 entitled "Re-mapping Control Method for Flash Memory and Structure of Flash Memory Thereof," which was previously proposed to solve such a problem, block state information is indicated using wrap-counts so as to recover from an error upon occurrence of the error (i.e., 1111: unsettled state; 1110 (S0), 1100 (S1), 1000 (S2): effective state; and 0000: deleted), so that a system can be recovered with a minimum of classified write-operations upon the occurrence of the error by classifying previous data and new data using the order of change of the wrap-counts, as shown in FIG. 2a.

FIG. 2b is a view showing a block structure of a flash memory according to such a re-mapping control method for the flash memory. The block structure comprises a data area in which substantial data are written, a logical sector (block) number ("lsn") area, a wrap count ("cnt") area, an lsn/cnt error correction code ("ecc_lsn") area, and a data error correction code ("ecc_data") area.

FIG. 2c illustrates processes of writing state information in respective blocks and recovering them with subsequent data upon occurrence of an error.

For example, if an error occurs after a fifth block of the flash memory, there are two valid data sets that have wrap counts of 1110 and 1100, respectively. Since 1110 is prior to 1100, the left data set would be deleted if a policy of recovery with the latest data were employed.

As described above, even the conventional flash memory control method does not provide a method of preventing the deterioration of system performance of a flash memory due to repeated write operations.

Therefore, there is a need for a flash memory access method capable of improving the performance of a flash memory system by reducing the number of write operations.

SUMMARY OF THE INVENTION

The present invention is directed to solving the above-described problems in the prior art. An object of the present invention is to minimize the process of a write operation by omitting the process of a write operation for writing changed flash memory state information in a previous PBN during the process of a recovery operation requested by a processor.

Another object of the present invention is to provide the process of a recovery operation for determining the latest data according to priorities and processing recovery even though one or more data sets exist in a specific LBN during the process of initializing a flash memory, based on the minimized process of the write operation.

A further object of the present invention is to improve the overall performance of a flash memory system by minimizing the performance deterioration of a flash memory due to repeated write operations through the minimized process of the write operation and the process of recovery operation in consideration thereof and by allowing a stable recovery even though an error occurs.

According to the present invention for achieving the objects, the process of the write operation for writing the changed flash memory state information in the previous PBN during the process of the update operation requested by the processor are omitted due to the process of the write operation in consideration of the process of the recovery operation. The latest data are determined and recovery is processed through the process of the recovery operation even though one or more data sets exist in a specific LBN during the process of initializing the flash memory.

To enable the latest data to be determined through the process of the recovery operation, priorities are given to lower blocks of the flash memory in the initialization process. While respective blocks are scanned based on their priorities, information on whether data will be written in LBNs of the respective blocks is written in relevant LBNs of a block allocation table.

Further, the latest data are determined and previous data are deleted by performing the process of the recovery operation through a memory reclaim process of transferring idle data existing in a predetermined unit of the flash memory to a new unit.

According to one aspect of the present invention, there is provided a flash memory access apparatus comprising a flash memory with regions divided on the basis of a unit that consists of predetermined blocks; and a flash memory controller. When a write operation is requested for a specific logical block number of the flash memory, the flash memory controller writes data and meta-information in a physical block corresponding to a logical block with the logical block number in the absence of a previous write operation for the logical block, but performs a write operation for writing the data and the meta-information allocated to the logical block in a new physical block without changing flash memory state information written in a previous physical block corresponding to the logical block in case of the presence of the previous write operation.

According to another aspect of the present invention, there is provided a flash memory access method comprising the steps of, if a processor requests a write operation for a specific logical block number of a flash memory, accessing the flash memory and searching for a currently writable physical block for the write operation; and writing data and meta-information in a physical block corresponding to a logical block with the logical block number in the absence of a previous write operation for the logical block, but writing the data and the meta-information in a new physical block corresponding to the logical block without changing flash memory state information written in a previous physical block corresponding to the logical block in case of the presence of the previous write operation.

BRIEF DESCRIPTION OF THE DRAWINGS

The above and other objects, advantages and features of the present invention will become apparent from the following description of preferred embodiments given in conjunction with the accompanying drawings, in which:

FIGS. 1A, 1B, 1C and 1D show views of blocks of a flash memory for illustrating processes of operations according to a conventional flash memory control method;

FIG. 2$b$ is a view showing a block structure of the flash memory according to the conventional re-mapping control method for the flash memory;

FIG. 2$c$ is a view of blocks of the flash memory for illustrating processes of writing state information in respective blocks and recovering them with subsequent data upon occurrence of an error;

DETAILED DESCRIPTION OF THE INVENTION

Hereinafter, a flash memory access apparatus and method according to the present invention will be described in detail with reference to the accompanying drawings.

First, a structure of a flash memory according to the present invention and the configuration and operation of the flash memory access apparatus for the flash memory will be described by way of examples with reference to the accompanying drawings.

Figure 2A:
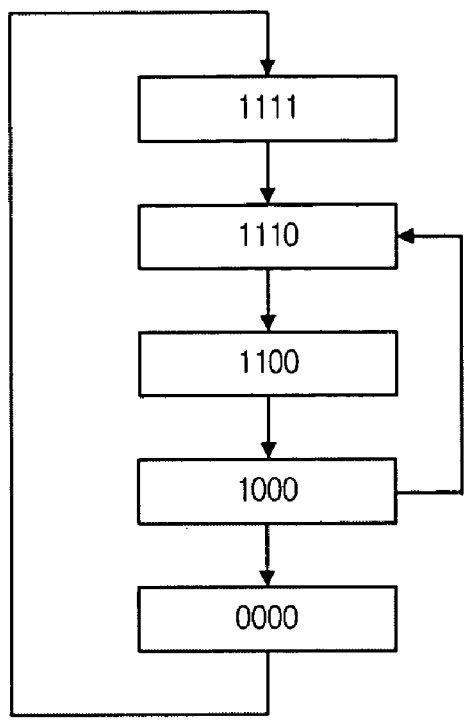
FIG. 2$a$ is a conceptual view of wrap counts according to a conventional re-mapping control method for a flash memory.
Figure 2B:
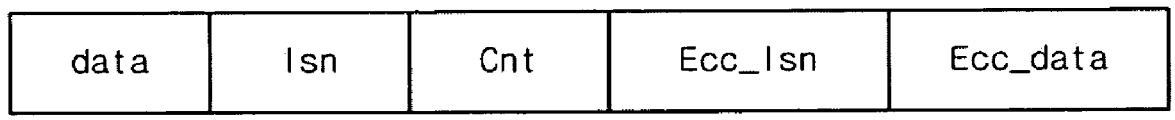
Figure 2C:
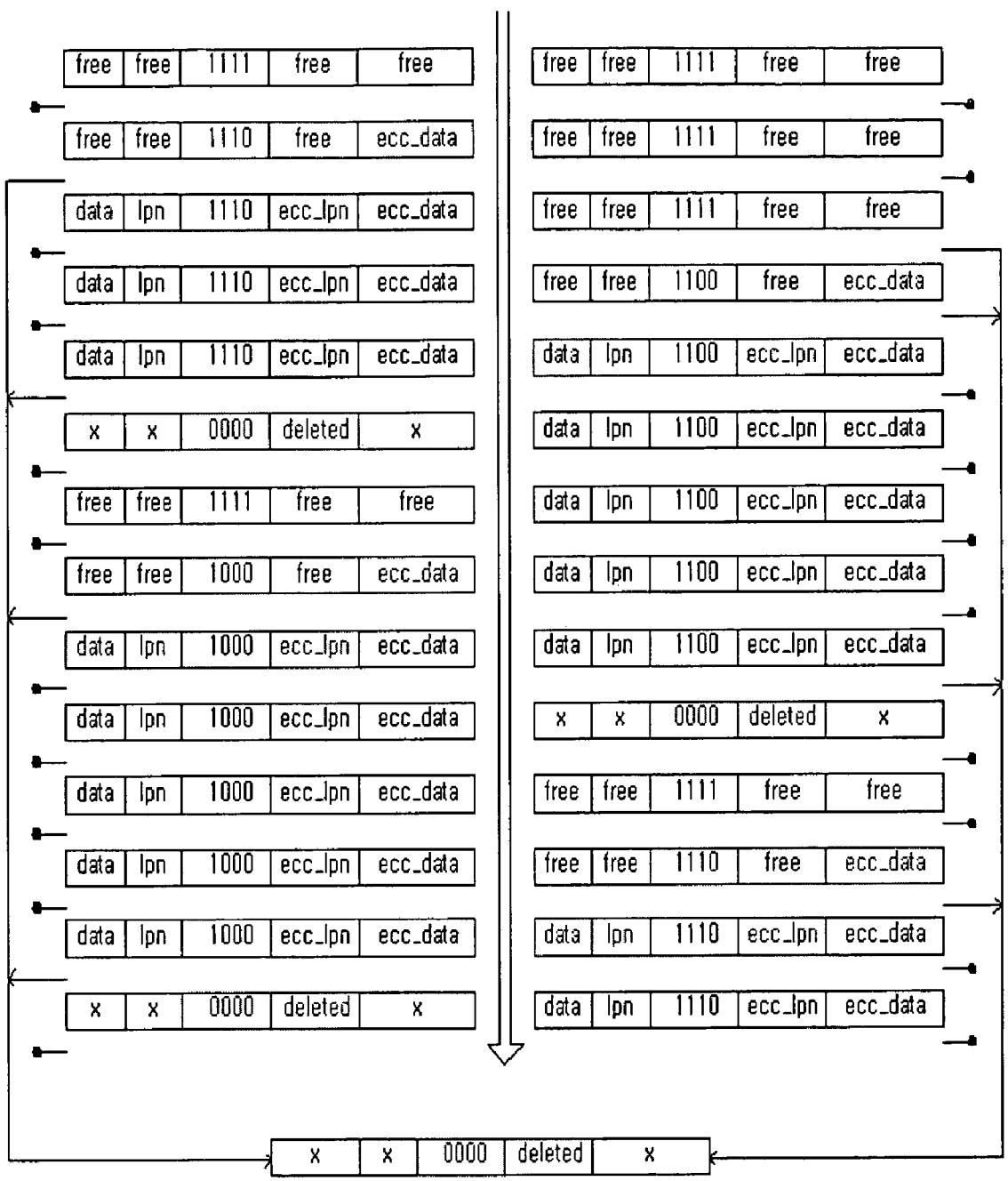
Figure 3:
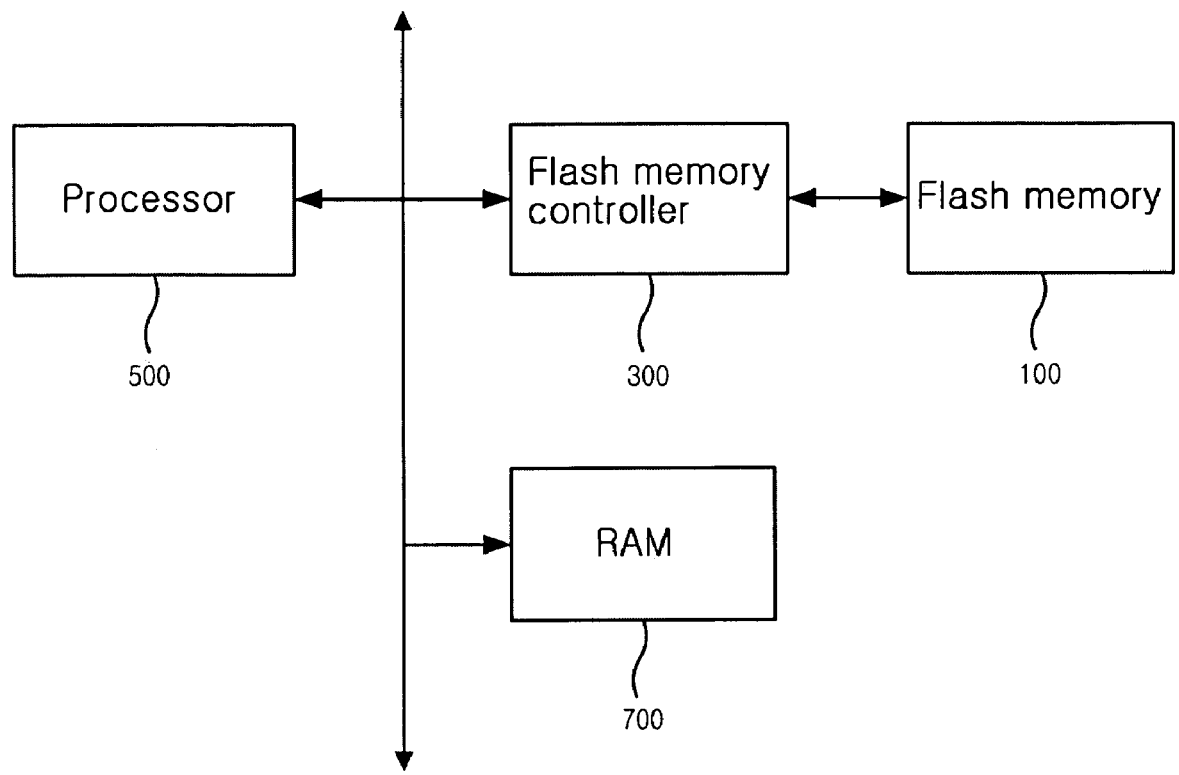
FIG. 3 shows a flash memory access apparatus according to an embodiment of the present invention.

FIG. 3 shows a flash memory access apparatus according to an embodiment of the present invention.

As shown in FIG. 3, the flash memory access apparatus according to the embodiment of the present invention comprises a flash memory 100, a flash memory controller 300 for accessing the flash memory 100 and controlling operations corresponding to write and update operations (hereinafter, collectively referred to as "write operations") for writing data and meta-information of designated logical blocks in writable physical blocks, a system processor 500 for generating control commands for causing written data to be read out from or data to be written in the flash memory 100 through the flash memory controller 300, and a RAM 700 for caching a variety of information (e.g., information on mapping between logical and physical units, information on access to respective logical blocks, and information on mapping between logical and physical blocks of respective units) stored in the flash memory 100 in order to improve the performance of the system.

Further, if one or more data sets exist in a specific LBN during an initialization process or a memory reclaim process of transferring valid data to a new unit, the flash memory controller 300 determines the latest data based on priorities obtained through a scanning process and performs the process of a recovery operation for deleting flash memory state information on data other than the latest data.

Each of the initialization and memory reclaim processes includes the process of scanning LBNs written in respective blocks based on a lower block of the flash memory 100, and a process of writing "0" or "1," which indicates a result value of investigation into whether data exist in the respective LBNs obtained during the scanning process, in a block allocation table (hereinafter, referred to as "BAT").

The BAT is stored in the RAM in order to ensure efficient access to the flash memory 100, and is a table for indicating the presence of written data in the respective LBNs obtained through the scanning process in order to determine the latest data among the data sets of the specific LBN during the process of the recovery operation.

As an example, in the flash memory initializing process of scanning the physical blocks of the flash memory 100 and writing the presence of data in the scanned physical blocks in relevant LBNs of the BAT, if "1" has been written in a relevant LBN field of the BAT corresponding to an LBN of a selected block, an LBN of data written in a searched physical block is the value of an LBN searched during a previous scanning process and the data of the searched physical block has a priority lower than that of data previously written in the physical block. Thus, the flash memory state information of the searched physical block is changed to "deleted."

The flash memory 100 comprises a plurality of units, and a erase operation is performed on a unit basis. Each unit is divided into a plurality of blocks, and a read or write operation for the flash memory 100 is performed on a block basis.

Figure 4:
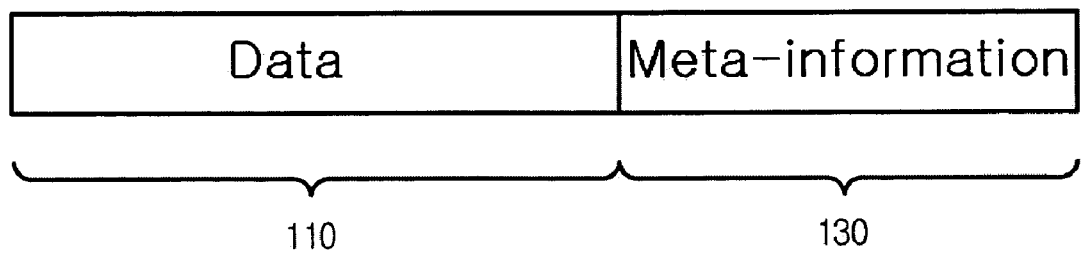
FIG. 4 shows a block structure of a NAND-type flash memory according to an embodiment of the present invention.

FIG. 4 shows a block structure of a NAND-type flash memory according to an embodiment of the present invention.

As shown in FIG. 4, each of blocks of the NAND-type flash memory 100 comprises a main area 110 and a spare area 130. Data are stored in the main area 110 and meta-information of the relevant block is stored in the spare area 130.

As an example, the spare area for storing the meta-information comprises subdivided areas in which a logical block number (LBN) and flash memory state information (including "valid," "deleted," or "invalid") are written respectively, and further comprises an area in which an error correction code ("ECC") is written.

In case of a NOR-type flash memory 100, the block state information may be stored in one or more leading blocks of each unit.

For reference, all modules of the flash memory access apparatus according to the embodiment of the present invention may consist of hardware or software modules, or some modules thereof may consist of software modules.

Therefore, construction of the flash memory access apparatus according to the embodiment of the present invention by means of hardware or software does not depart from the sprit and scope of the present invention. It will be apparent that modifications and changes according to the construction using hardware and/or software may be made without departing from the spirit and scope of the present invention.

A flash memory access method using the flash memory and the flash memory access apparatus of the present invention will be described by way of example with reference to the accompanying drawings.

In explaining the process of accessing the flash memory 100 of the present invention, a detailed description of the process of a read operation will be omitted since it is the same as the conventional process.

Therefore, the process of the write operation in consideration of the process of the recovery operation according to the present invention will be first described, and the process of an error recovery operation for performing a write operation for error recovery during the initialization process will be then described.

Further, a memory reclaim process of performing the process of a write operation for error recovery while transferring only valid data among data written in the flash memory 100 to a new unit will be described.

1. Process of a Write Operation

The process of a write operation is to search an available physical block in order to write data of a logical block, which is designated according to a write operation requested by the processor 500, in a specific physical block of the flash memory 100, and subsequently to write the data and meta-information associated therewith in the physical block.

Figure 5:
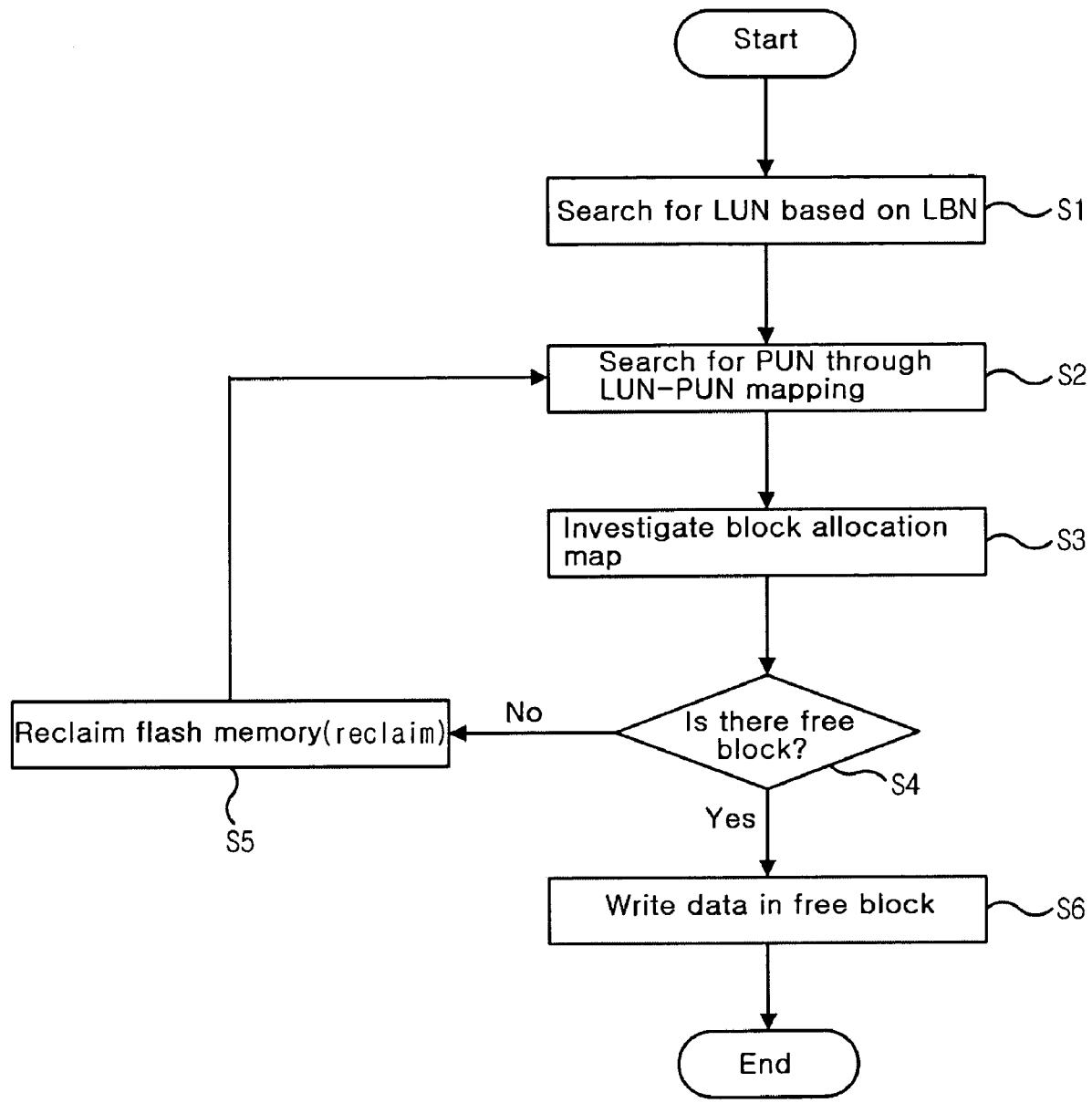
FIG. 5 is a flowchart illustrating the process of a write operation of the flash memory according to an embodiment of the present invention.

FIG. 5 is a flowchart illustrating the process of a write operation of the flash memory according to an embodiment of the present invention.

As shown in FIG. 5, if a logical block address is input together with a write command, the flash memory controller 300 first searches for an LUN based on a designated LBN through an LBN-LUN table in order to determine a physical block in which data will be written (S1), and searches for a PUN in a mapping table (i.e., LUN-PUN table) of logical and physical units by using the searched LUN (S2).

Then, a BAM is investigated to search for whether there is a currently writable physical block among physical blocks of the searched PUN (S3). It is determined whether there is a free block among the physical blocks constituting the searched PUN (S4).

If it is determined that there is no free block, the memory reclaim process by which only valid data of a specific logical block among data written in a relevant physical unit are transferred to a new unit is performed and the procedure returns to a routine for searching for a PUN through the LUN-PUN table (S5). If it is determined that there is a free block, data and meta-information are written in the searched free block (S6).

As for the data and meta-information, the data are written in the main area of the block and an LBN of meta-information is written in the spare area of the block so as to ensure the stable writing of relevant data.

When the write operation for the data and LBN is completed in such a way, state information of "valid" for the flash memory 100 according to the write operation is written in the spare area of the block.

If atomicity for a write operation on a block basis is ensured, the data and meta-information can be simultaneously written.

2. Initialization Process

The initialization process enables the flash memory controller 300 to load mapping information written in the flash memory 100 in order to efficiently access the flash memory 100 according to an operation requested by the processor 500.

Hereinafter, an initialization process explained in connection with an embodiment of the present invention is defined as an initialization process performed due to sudden power failure. An error recovering process for recovering the flash memory system from an error due to sudden power failure during the initialization process will be explained.

However, the present invention is not limited only to the initialization process due to sudden power failure but can be applied to all initialization processes for the flash memory 100.

Figure 6:
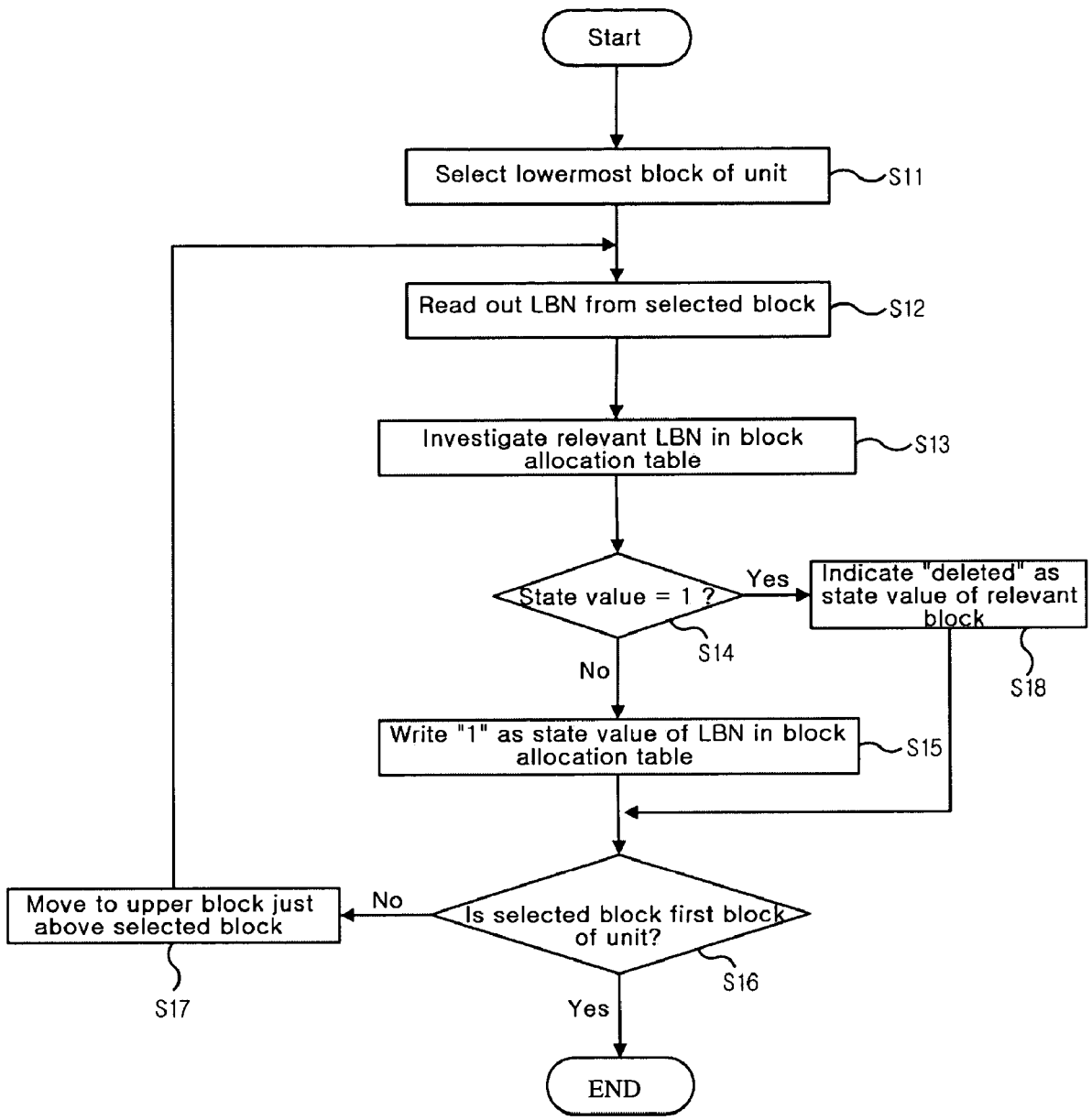
FIG. 6 is a flowchart illustrating the process of initializing the flash memory according to an embodiment of the present invention.

FIG. 6 is a flowchart illustrating the process of initializing the flash memory according to the embodiment of the present invention.

As shown in FIG. 6, for each unit, the flash memory controller 300 first loads all the flash memory information to be written in a header of the flash memory 100 and then selects a lowermost physical block of a unit in order to scan the flash memory 100 (S11). After priority is given to the selected physical block, physical blocks of the flash memory 100 are scanned.

Accordingly, an LBN is read out from the selected physical block (S12) and a relevant LBN field is searched for in a BAT by using the read LBN (S13).

Then, it is determined whether a state value written in the searched LBN field is "1" (S14). If it is determined that the state value is not "1," "1" is written as a state value of the LBN in the BAT (S15). Subsequently, it is determined whether the selected physical block is a first block of the relevant unit (S16).

If it is determined that the selected physical block is not the first block, movement is made to an upper block just above the selected physical block, which in turn is selected (S17). Then, the procedure returns to a routine for reading out a state value of an LBN from the selected upper block.

Returning now to S14, it is determined whether the state value of the LBN searched in the BAT is "1." If it is determined that the state value of the LBN is "1," the flash memory state information of the relevant block is indicated as "deleted" (S18).

When a physical block of which a state value of a relevant LBN written in the BAT is "1" is searched during the scanning process in such a way, data of the LBN written in the searched physical block has a priority lower than that of previously searched data of the LBN in the block. Thus, state information of "deleted" is indicated to prevent an error due to valid data with the same LBN.

3. Reclaim Process

The reclaim process is to copy only valid data written in a certain unit to a new unit if there is no currently writable free block in the relevant unit in which data to be subjected to a write operation requested by the processor will be written.

Figure 7:
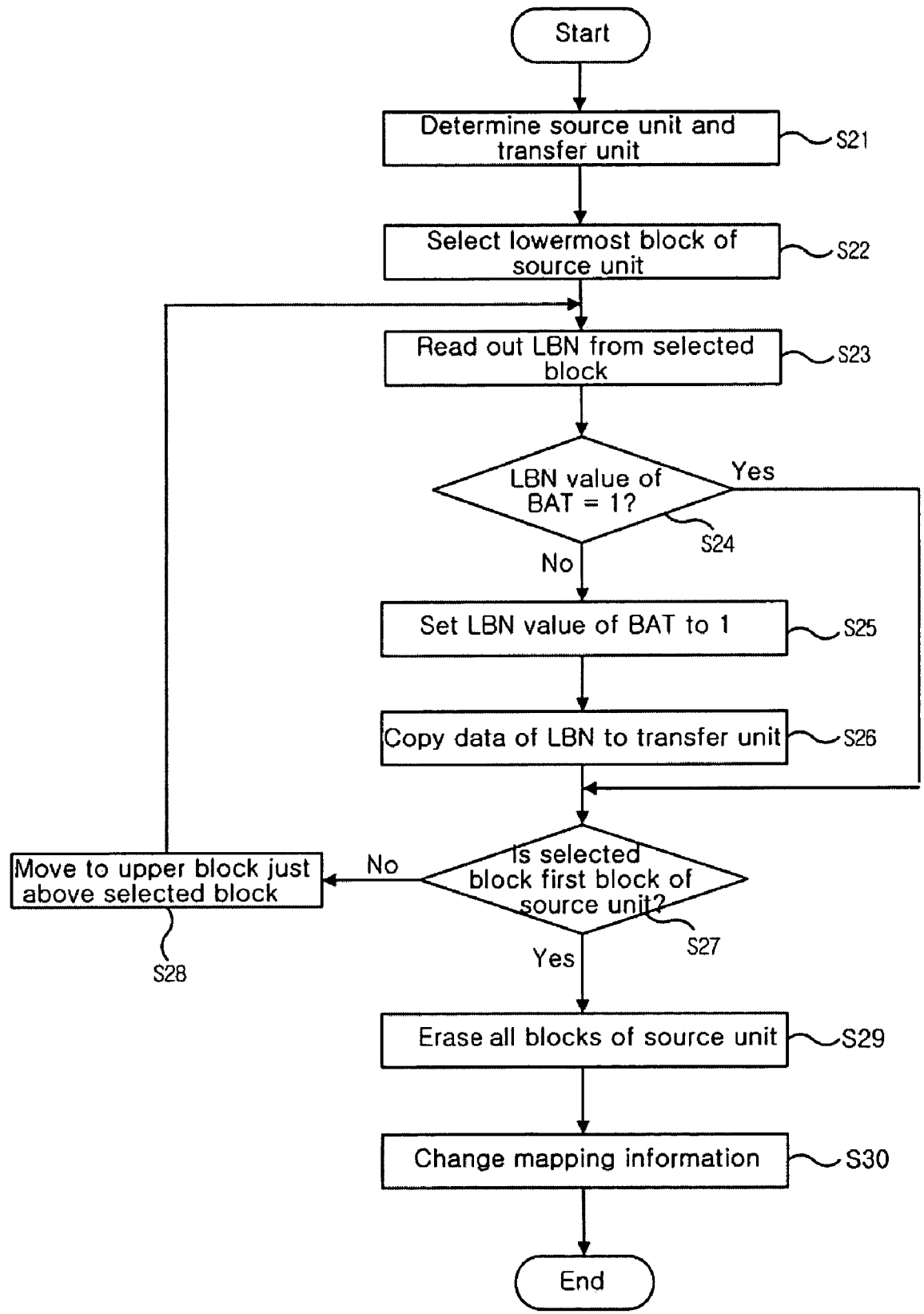
FIG. 7 is a flowchart illustrating the process of reclaiming the flash memory according to an embodiment of the present invention.

FIG. 7 is a flowchart illustrating the process of reclaiming the flash memory according to an embodiment of the present invention.

As shown in FIG. 7, the flash memory controller 300 first determines a source unit from which written valid data is required to be moved, and a transfer unit that is a new unit to which the idle data will be moved (S21).

Then, a lowermost block of the source unit is selected (S22), and an LBN of the selected block is read out (S23).

Subsequently, a relevant LBN is searched for in a BAT by using the read LBN and it is determined whether a state value of the searched LBN is "1" (S24).

If it is determined that the state value of the LBN is not "1," a state value of the LBN in the BAT is set to "1" (S25), and data of the LBN are copied to the transfer unit (S26).

When previous relevant data of the LBN are searched and it is determined that the state value of the LBN is "1," it is determined whether the currently selected block is a first block of the source unit (S27).

If it is determined that the selected block is not the first block of the source unit, movement is made to an upper block just above the selected block, which in turn is selected (S28). Then, the procedure returns to a routine for reading out an LBN from the selected upper block.

If it is determined that the selected block is the first block of the source unit, all blocks of the source unit are erased (S29) and LUN-PUN mapping information is changed accordingly (S30).

The error recovery process of the present invention is performed in such a manner that only data existing in the lowermost block among a plurality of data sets of specific logical blocks existing in the source unit are copied, as valid data, to the transfer unit through the process of copying the valid data written in the source unit to the transfer unit.

The flash memory access method of the present invention performed in such a way will be described in detail by way of example with reference to the accompanying drawings.

Figure 8A:
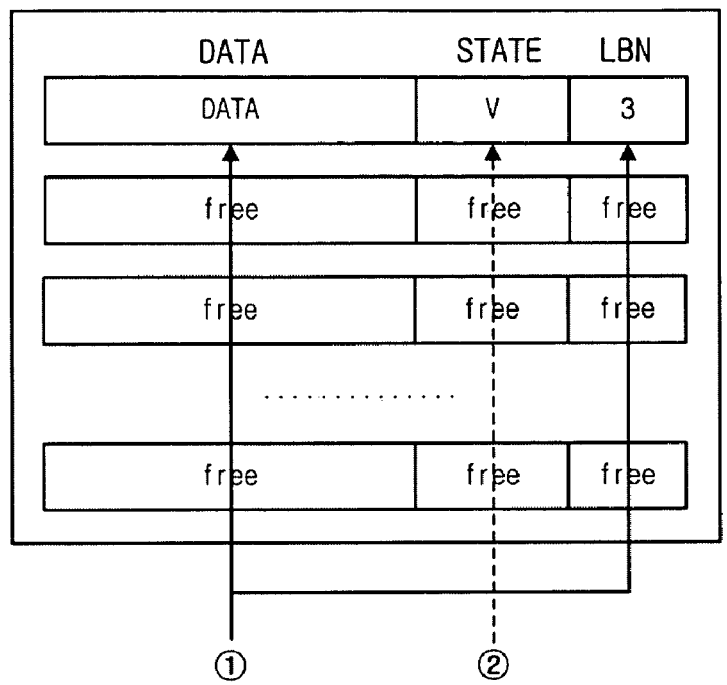
FIGS. 8$a$ to 8$c$ show the process of accessing the flash memory according to an embodiment of the present invention.
Figure 8B:
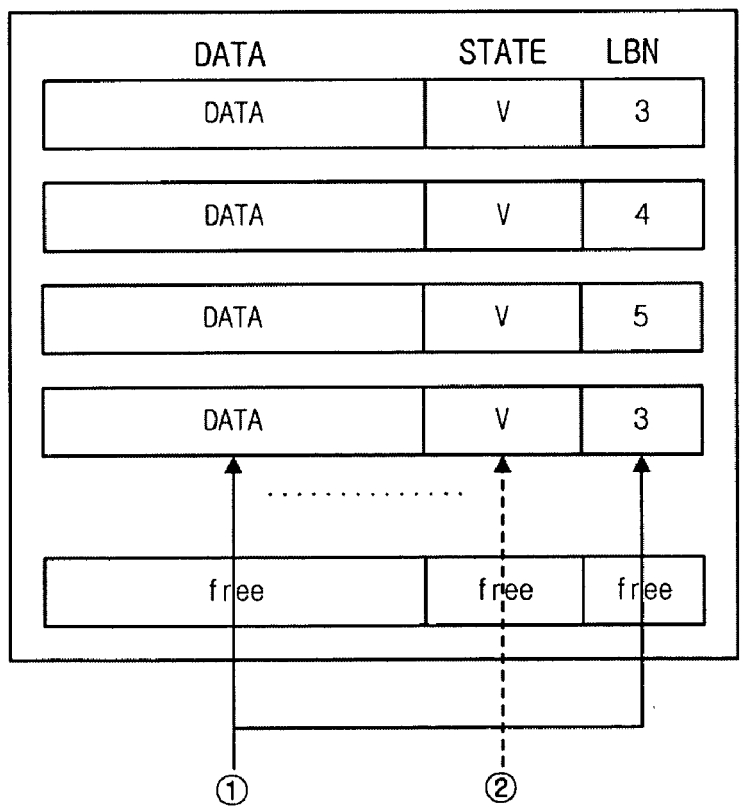
Figure 8C:
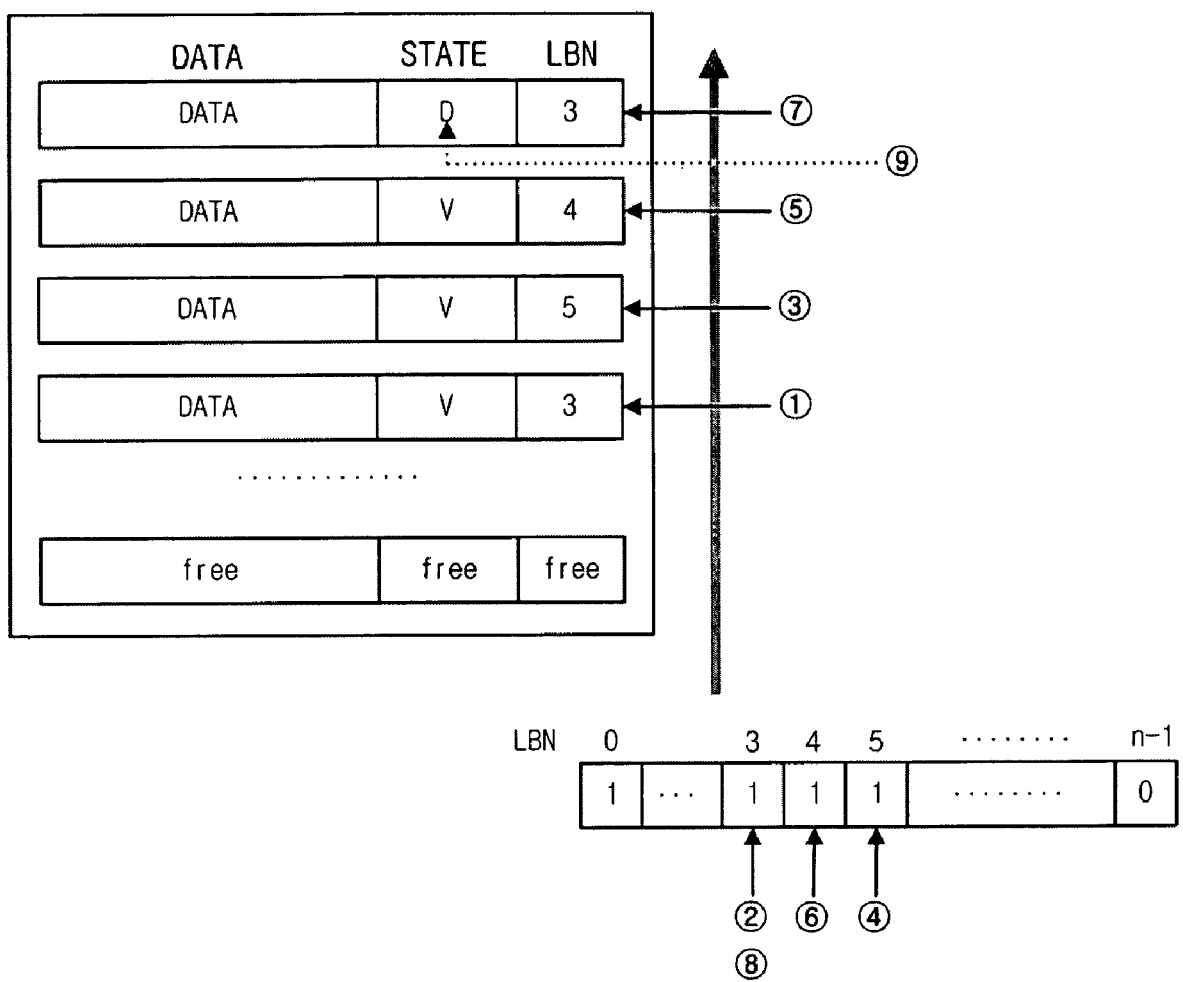

FIGS. 8*a* to 8*c* show the process of accessing the flash memory according to an embodiment of the present invention.

As shown in FIG. 8*a*, when the processor 500 requests a write operation for a specific LBN 3, the flash memory controller 300 first refers to the LBN-LUN mapping table and searches for an LUN to which the LBN 3 to be subjected to the write operation belongs, in order to access a data-writable physical block of the flash memory 100.

When the LUN is determined through the LBN-LUN mapping table, a PUN for the LUN is determined by referring to the LUN-PUN mapping table. The position of a physical block in which data of LBN 3 designated by the processor 500 can be written is searched for from a BAM of the determined PUN.

When a currently writable PBN is searched for in such a way, the flash memory controller 300 writes data in a main area of the searched PBN 1, and LBN 3 designated by the processor in a spare area of the PBN 1 (①).

When the data and LBN 3 are completely written, the write operation requested by the processor 500 is stably finished. Accordingly, in order to indicate that the data has been written in a relevant block, flash memory state information of the spare area is indicated as "valid" (②).

If the processor 500 requests a write operation for updating the data of LBN 3 written in PBN 1 of the flash memory during such a write operation, the flash memory controller 300 searches for a currently writable PBN in order to write data to be updated as shown in FIG. 8*b*.

As a result of the search, if specific PBN 4 is searched for as a free block, the data to be updated is written in a main area of searched PBN 4 and allocated LBN 3 is written in a spare area thereof (①).

Then, when the write operation for the data and LBN 3 is completed, the write operation requested by the processor 500 is stably finished. Accordingly, in order to indicate that the data has been written in PBN 4, flash memory state information of the spare area is indicated as "valid" (②).

If the system is shut down due to sudden power failure in the flash memory 100 where such write operations are performed, and the flash memory is then supplied with electric power, the flash memory controller 300 performs the initialization process of initializing the flash memory.

First, in order to access the latest accessed block in the flash memory 100, the flash memory controller 300 selects PBN 4 that is a lowermost block of a unit including the latest accessed block.

Then, LBN 3 written in the spare area of selected PBN 4 is read out, and a state value written in a relevant field of LBN 3 in a BAT is investigated by using read LBN 3.

As a result of the investigation, if the state value of LBN 3 written in the BAT is not "1," a state value of "1" is indicated in the relevant field of LBN 3 in the BAT. Subsequently, the scanning process for determining whether selected PBN 4 is a first block of the unit and investigating the state of each block of the unit while moving to an upper block just above each block is performed.

If the state value of the LBN written in the BAT is "1" during such a scanning process, it means that the same LBN with valid data was searched for during a previous scanning process. Flash memory state information written in a spare area of a relevant block currently selected according to scanning priority is indicated as "deleted."

That is, as shown FIG. 8c, if PBN 4 in which the updated data for specific LBN 3 has been written was accessed most recently, a fifth block is selected as a lower block of the unit during the process of scanning the flash memory so as to read out LBN 3 (①).

A state value written in relevant LBN 3 in the BAT is investigated by using the read LBN 3. Since LBN 3 is a lower block that was accessed most recently, a state value has not been written and thus is "0." Therefore, a state value of "1" is written in the relevant field of LBN 3 in the BAT (②).

Then, it is determined whether the selected block is a first block of the unit. Since the selected block is a lower block of the unit, an upper block just above the selected block is selected.

Accordingly, PBN 3 is selected (③), and by using LBN 5 obtained by searching selected PBN 3, a state value written in a relevant field of LBN 5 in the BAT is investigated.

Based on results of the investigation, a state value of "1" is written in the field of LBN 5 in the BAT corresponding to LBN 5 of data written in selected PBN 3 (④). Since currently selected PBN 3 is not the first block, PBN 2 just above the PBN 3 is selected.

Then, LBN 4 written in selected PBN 2 is read out (⑤). After a state value written in a field of LBN 4 in the BAT corresponding to read LBN 4 is investigated, a state value of "1" is written therein (⑥).

Next, if PBN 1 is selected through such a scanning process (⑦), LBN 3 written in selected PBN 1 is read out and a state value written in a field of LBN 3 corresponding to the BAT is investigated (⑧).

In this process, since a state value of "1" has been written in the relevant field of LBN 3 in the BAT due to information written during a previous scanning process, it is determined according to scanning priority that PBN 4 including previous LBN 3 is a block with valid data written therein, and PBN 1 is determined as an invalid block.

Accordingly, flash memory state information written in a spare area of PBN 1 is changed to "deleted" (⑨).

Due to the minimized write operations in consideration of the error recovery process of the present invention through such a scanning process, the latest data is selected among valid data existing in a specific logical block, allowing recovery from an error.

According to the present invention, the number of write operations required upon updating data of a specific logical block of the flash memory is minimized, thereby ensuring maximum performance of the flash memory system.

Further, since valid data are determined through priorities of data of a specific logical address in the process of initializing the flash memory, stable error recovery can be made even if an error caused by sudden power failure occurs.

Although the present invention has been described in connection with the preferred embodiments thereof shown in the accompanying drawings, they are mere examples of the present invention. It can also be understood by those skilled in the art that various changes and equivalents thereof can be made thereto without departing from the scope and spirit of the present invention defined by the claims. Therefore, the true technical scope of the present invention should be defined by the technical spirit of the appended claims.

What is claimed is:

1. A flash memory access apparatus, comprising:
   a flash memory comprising a plurality of units, each of the units comprising a plurality of blocks; and
   a flash memory controller,
   wherein if a write operation is requested for a logical block number of the flash memory, the flash memory controller is configured to write data and meta-information comprising flash memory state information comprising an indicator, which indicates a state of the physical block as valid, deleted, or invalid, in the physical block corresponding to a logical block with the logical block number if a previous write operation has not been performed for the logical block, and the flash memory controller is configured to perform a write operation for writing the data and the meta-information, comprising writing the valid indicator, allocated to the logical block in a new physical block without changing flash memory state information, wherein the flash memory state information is written in a previous physical block corresponding to the logical block if the previous write operation has been performed for the logical block,
   wherein the flash memory state information is time independent,
   wherein the flash memory controller is configured to perform a recovery operation which detects, during a scanning process, physical blocks for the logical block number and recovers from an error by determining a valid block for the logical block among the detected physical blocks,
   wherein the scanning process comprises reading a logical block number for each of the physical blocks by investigating the flash memory based on a latest accessed block, and investigating a field of a block allocation table corresponding to the read logical block number, and
   wherein the investigating the field of the block allocation table comprises writing a state value of "1" in the field of the block allocation table if the state value has been "0," and detecting that the logical block number has been searched for through the previous physical block during the scanning process, if the state value is "1".

2. The apparatus as claimed in claim 1, wherein each physical block comprises:
   a first area, into which the data is written, and
   a second area, into which meta-information is written.

3. The apparatus as claimed in claim 1, wherein the data and meta-information of the logical block are simultaneously written.

4. The apparatus as claimed in claim 1, wherein the meta-information further comprises the logical block number.

5. The apparatus as claimed in claim 1, wherein the recovery operation recovers from an error by determining a latest accessed physical block for the logical block number among the detected physical blocks according to priorities set during the scanning process, as the valid block, and rewriting flash memory state information written in other physical blocks of the detected physical blocks as deleted.

6. The apparatus as claimed in claim 1, wherein the recovery operation is performed during the initializing the flash memory.

7. The apparatus as claimed in claim 1, wherein the recovering from the error is performed during reclaiming the flash memory wherein the reclaiming comprises moving data written in a predetermined unit of the flash memory to a new unit.

8. A flash memory access method comprising:
accessing the flash memory and searching for a currently writable physical block if a processor requests a write operation for a specific logical block number of the flash memory; and
writing data and meta-information, comprising flash memory state information comprising an indicator which indicates a state of the physical block as valid, deleted, or invalid, in the physical block corresponding to a logical block with the logical block number if a previous write operation has not been performed for the logical block, and writing the data and the meta-information comprising writing the valid indicator in a new physical block corresponding to the logical block without changing flash memory state information, wherein the flash memory state information is written in a previous physical block corresponding to the logical block if the previous write operation has been performed for the logical block,
wherein the flash memory state information is time independent,
the method further comprises a recovery operation comprising detecting, during a scanning process, physical blocks for the logical block number and of recovering from an error by determining a valid block for the logical block among the detected physical blocks, and
wherein the scanning process comprises:
reading a logical block number for each of the physical blocks by investigating the flash memory based on a latest accessed block, and investigating a field of a block allocation table corresponding to the read logical block number; and
writing a state value of "1" in the field of the block allocation table if the state value has been "0," and detecting that the logical block number has been searched for through the previous physical block during the scanning process, if the state value is "1".

9. The method as claimed in claim 8, wherein each physical block comprises first and second areas, the method further comprising:
writing the data into the first area; and
writing the meta-information into the second area.

10. The method as claimed in claim 8, wherein the data and meta-information of the logical block are simultaneously written.

11. The method as claimed in claim 8, wherein the meta-information comprises the logical block number, and the flash memory state information indicating a state of the physical block as valid, deleted, or invalid.

12. The method as claimed in claim 8, wherein the recovering comprises recovering from the error by determining a latest data written among data of a specific logical block number detected during reclaiming the flash memory, and wherein the reclaiming comprises moving data written in a predetermined unit of the flash memory to a new unit.

13. A flash memory access apparatus, comprising:
a flash memory comprising a plurality of units, each of the units comprising a plurality of blocks; and
a flash memory controller,
wherein if a write operation is requested for a logical block number of the flash memory, the flash memory controller is configured to write data and meta-information comprising flash memory state information comprising an indicator, which indicates a state of the physical block as valid, deleted, or invalid, in the physical block corresponding to a logical block with the logical block number if a previous write operation has not been performed for the logical block, and the flash memory controller is configured to perform a write operation for writing the data and the meta-information, comprising writing the valid indicator, allocated to the logical block in a new physical block without changing flash memory state information, wherein the flash memory state information is written in a previous physical block corresponding to the logical block if the previous write operation has been performed for the logical block,
wherein the flash memory state information is time independent, and
wherein the flash memory controller is configured to perform a recovery operation to recover from an error and identify a valid block for the logic block, the recovery operation comprising:
detecting a last accessed physical block which is a lowermost physical block in a physical block unit that has been accessed the latest;
determining a last accessed logic block which corresponds to the detected last accessed physical block; and
changing a scanning identifier for the determined last accessed logic block to a first identifier in a block allocation table, if the scanning identifier of the determined last accessed logic block is different from the first identifier.

14. The apparatus as claimed in claim 13, wherein the recovery operation further comprises:
scanning remaining physical blocks in the physical block unit in an ascending order from the detected last accessed physical block; and
for each physical block, changing the scanning identifier of a corresponding logic block to a second identifier, if the scanning identifier of the corresponding logic block comprises the first identifier.

15. The apparatus as claimed in claim 14, wherein the recovery operation further comprises:
identifying the physical blocks which correspond to the same logic block; and
changing the indicator of the memory state information of the identified physical blocks to deleted, if the scanning identifier of the logic block comprises the second identifier.

16. The apparatus as claimed in claim 14, wherein changing to the first identifier comprises writing a value of "1" in a field of the block allocation table if a previous value has been "0," and detecting that the logical block has been searched for through the previous physical block during the scanning process, if the value comprises "1".

* * * * *